United States Patent
Chun et al.

(10) Patent No.: US 6,429,676 B1
(45) Date of Patent: Aug. 6, 2002

(54) SEMICONDUCTOR CHIP GROUND NOISE IMMUNITY TESTING SYSTEM AND TESTER

(75) Inventors: Chan-Woong Chun, Ansan; Sam Jin Hwang, Suwon, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/458,461

(22) Filed: Dec. 9, 1999

(30) Foreign Application Priority Data

Dec. 29, 1998 (KR) ............................................. 98-59883

(51) Int. Cl.$^7$ ............................................. G01R 31/26
(52) U.S. Cl. ............................................. 324/765
(58) Field of Search ............................ 324/73.1, 765, 324/537; 326/22, 33; 365/189.09, 206

(56) References Cited

U.S. PATENT DOCUMENTS 5,418,746 A  *  5/1995  Choi .................... 365/189.05
5,842,155 A  * 11/1998  Bryson et al. .............. 702/124
5,883,521 A  *  3/1999  Nishikawa .................. 324/765

* cited by examiner

Primary Examiner—N. Le
Assistant Examiner—Etienne P LeRoux
(74) Attorney, Agent, or Firm—Marger Johnson & McCollom, P.C.

(57) ABSTRACT

A semiconductor chip testing system comprises a tester with a predetermined number of pin drivers; high current and low current drivers are connected between the pin drivers of the tester and a ground voltage applying terminal of the semiconductor chip to be tested. Control signals are applied to the pin drivers according to a testing method of a tester to generate ground noise at the ground voltage applying terminal of the semiconductor chip, thereby performing a ground noise immunity test on the semiconductor chip. A semiconductor chip tester comprises a predetermined number of pin drivers with large current driving capacity; and a predetermined number of pin drivers with small current driving capacity, wherein ground noise control signals are applied to the pin drivers with large current driving capacity according to a test program to apply ground noise to a ground voltage applying terminal of a semiconductor chip to be tested while the semiconductor chip is tested according to the test program. Ground noise thus is induced to the semiconductor chip to ensure immunity from ground noise of the semiconductor chip. A semiconductor chip that cannot endure the higher range of ground noise during the test is classified as defective.

20 Claims, 4 Drawing Sheets

SEMICONDUCTOR CHIP GROUND NOISE IMMUNITY TESTING SYSTEM AND TESTER

FIELD OF THE INVENTION

The present invention relates to a tester of a semiconductor chip, and more particularly to a semiconductor chip testing system and a tester for testing immunity from ground noise of the semiconductor chip.

BACKGROUND OF THE INVENTION

As semiconductor chips achieve higher speeds and higher integration, they are more susceptible to a ground bounce phenomenon. Ground bounce results from stray inductances in signal lines and current changes during high speed switching. Moreover, the ground level varies in relation to crosstalk caused by mutual inductance and capacitance between signal lines. These phenomena are called ground noise.

In addition, ground noise immunity means resistance to a noise generating environment, that is, a function of a chip which can normally perform its operations in spite of the noise generated inside or outside the chip when the chip is packaged and assembled to operate within a circuit or electronic system.

For conventional testers a ground voltage is applied to a terminal of the chip from the ground of the tester, so that there is almost no possibility that noise is induced into the ground voltage applying terminal of the chip. However, when the semiconductor chip is applied to the actual system, it becomes possible that the noise being generated internally at the system is induced into the ground voltage applying terminal of the chip. Therefore, even if the chip is classified as normal at the time of the test, the semiconductor chip may not function properly due to the ground noise when it is actually assembled into a system.

This is because the conventional tester of the semiconductor chip performs a test without consideration of the ground noise.

Accordingly, a test could be performed by the conventional tester while ground noise is continuously induced into the ground voltage applying terminal of the semiconductor chip. Such testing would more closely simulate operational conditions of the semiconductor chip.

However, there is a problem with this approach. A large current is required to enable the ground noise to be induced into the ground terminal of the semiconductor chip and thus simulate actual operating conditions. Unfortunately, the current driving capacity of a pin driver of the conventional tester is only about 25 mA which is not enough to simulate ground noise when the semiconductor chip is tested. Thus, semiconductor chips continue to be tested without sufficient concern for the real-world problems in operation of induced ground noise.

SUMMARY OF THE INVENTION

It is an object to provide a testing system of a semiconductor chip which can improve reliability of the semiconductor chip by testing ground noise immunity when the semiconductor chip is tested.

It is another object to provide a tester of a semiconductor chip that performs the function of testing the chip's ground noise immunity.

In order to accomplish the aforementioned object, there is provided a semiconductor chip testing system which comprises:

a tester with a predetermined number of pin drivers; and driving means connected between the pin drivers of the tester and a ground voltage applying terminal of the semiconductor chip to be tested, wherein control signals are applied to the pin drivers according to a testing method of a tester to generate ground noise at the ground voltage applying terminal of the semiconductor chip, thereby performing a test on the semiconductor chip.

In order to accomplish the aforementioned second object, there is provided a tester of the semiconductor chip comprising:

a predetermined number of pin drivers with large current driving capacity; and a predetermined number of pin drivers with small current driving capacity, wherein control signals are applied to the pin drivers with large current driving capacity according to a test program to apply ground noise to a ground voltage applying terminal of a semiconductor chip to be tested while the semiconductor chip is tested according to the test program.

DETAILED DESCRIPTION OF THE INVENTION

A semiconductor chip testing system and a tester of the present invention will be described with reference to the accompanying drawings.

Figure 1:
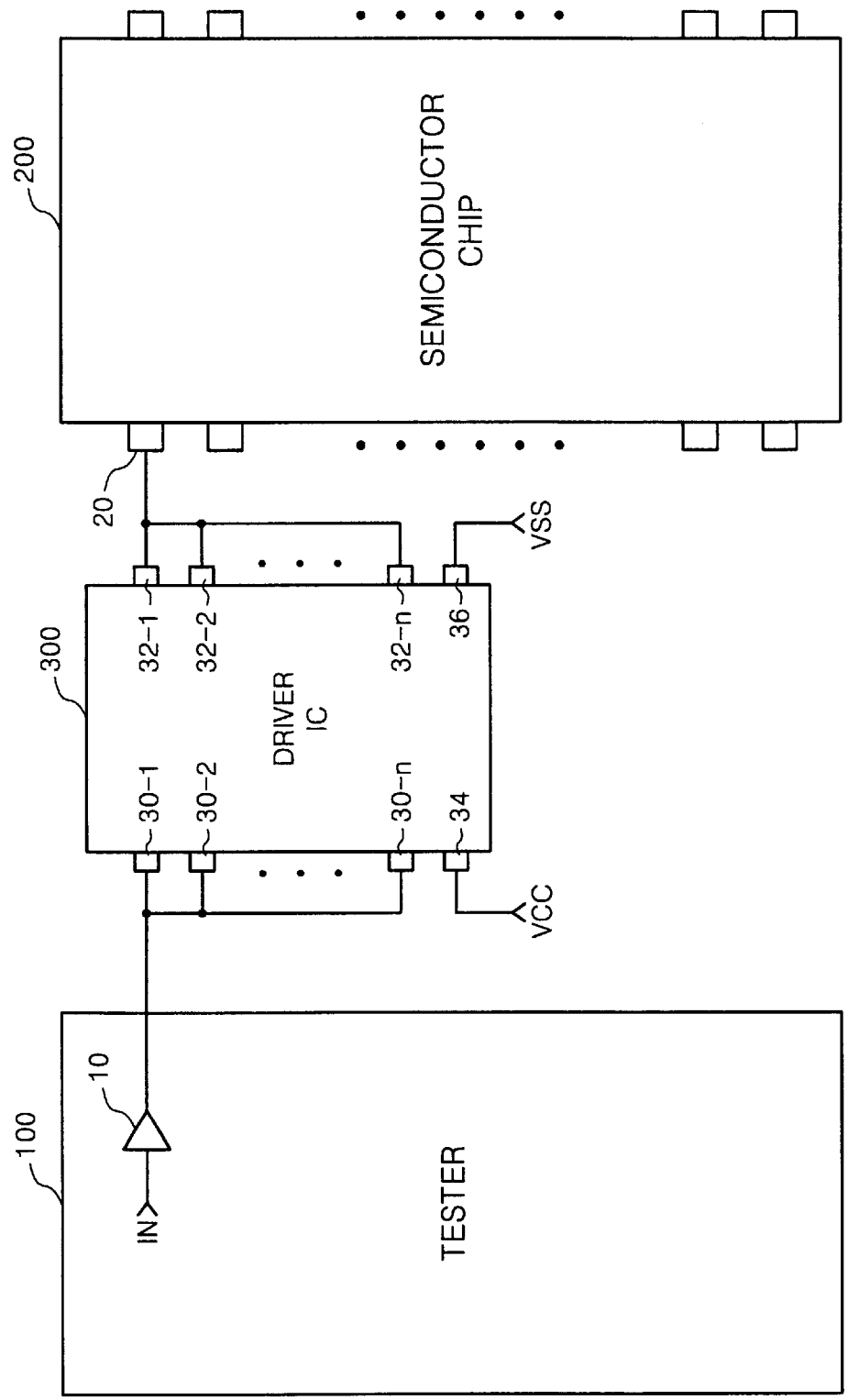
FIG. 1 is a block diagram of a testing circuit to test ground noise immunity of a semiconductor chip in accordance with an embodiment of the present invention.

FIG. 1 is a block diagram illustrating a semiconductor chip testing system of the present invention, comprising a conventional tester 100, a conventional semiconductor chip 200 and a novel driver IC 300 interposed between tester 100 and chip 200.

A typical pin driver 10 represents all the pin drivers disposed in the tester 100. A typical ground voltage applying terminal 20 represents all the grounding pins of semiconductor chips like chip 200. The driver IC 300 comprises input terminals of a buffer 30-1, 30-2, . . . , 30-n, output terminals of a buffer 32-1, 32-2, . . . , 32-n, a supply voltage VCC applied to a terminal 34 and a ground voltage VSS applied to a terminal 36 wherein the input terminals of a buffer 30-1, 30-2, . . . , 30-n and the output terminals of a buffer 32-1, 32-2, . . . , 32-n are respectively connected together.

A testing method for testing ground noise immunity of the semiconductor chip of the test system thus constructed will be described.

The driver IC 300 is used for increasing the current driving capacity of the pin driver 10 of the tester 100. Tester 100 applies high or low levels of signals to the pin driver 10 of the tester 100 at regular or irregular time intervals. At this time, the level and time interval of the signals applied to the pin driver 10 can be controlled by a testing program of the tester 100. Then, the pin driver 10 outputs input signals to the input terminals 30-1, 30-2, . . . , 30-n. The driver IC 300 outputs sufficient current to the output terminals 32-1, 32-2, . . . , 32-n in response to the output signals of the pin driver 10.

At this time, the high level of the output signal becomes a level of voltage to be applied to the supply voltage VCC applying terminal 34 of the driver IC 300. On the other hand, the low level of the output signal becomes a level of voltage to be applied to the ground voltage VSS applying terminal 36 of the driver IC 300. As the output terminals 32-1, 32-2, . . . , 32-n are connected together, the current of the signals to be applied to the ground voltage applying terminal 20 of the semiconductor chip 200 is sufficient. In order to apply current greater than that required to operate the semiconductor chip 200, the number of buffers inside the driver IC 300 can be controlled for the magnitude of the current to be applied to the ground voltage applying terminal 20. For example, if the current driving capacity of each buffer inside the driver IC 300 is 25 mA and the current required to operate the semiconductor chip 200 is 500 mA, then, 20 buffers inside the driver IC 300 are connected in parallel to thereby apply the current of 550 mA to the ground voltage applying terminal 20 of the semiconductor chip 200.

As shown in FIG. 1, the driver IC 300 is connected to the pin driver 10 of the tester 100, so that the current driving capacity of the pin driver 10 increases. Also, when a test program of the tester 100 is used, the ground noise which may be produced, when the semiconductor chip is mounted in a circuit, can be applied to the ground voltage applying terminal 20 of the semiconductor chip 200.

For example, if semiconductor memory device is tested, read and write commands and control signals such as row and column address strobes are sent from the tester 100 to the semiconductor memory device. Whenever the control signals are sent to the semiconductor memory device by way of the tester 100, the signal IN to be applied to the pin driver 10 can be controlled at a high level to thereby generate ground noise.

Figure 2:
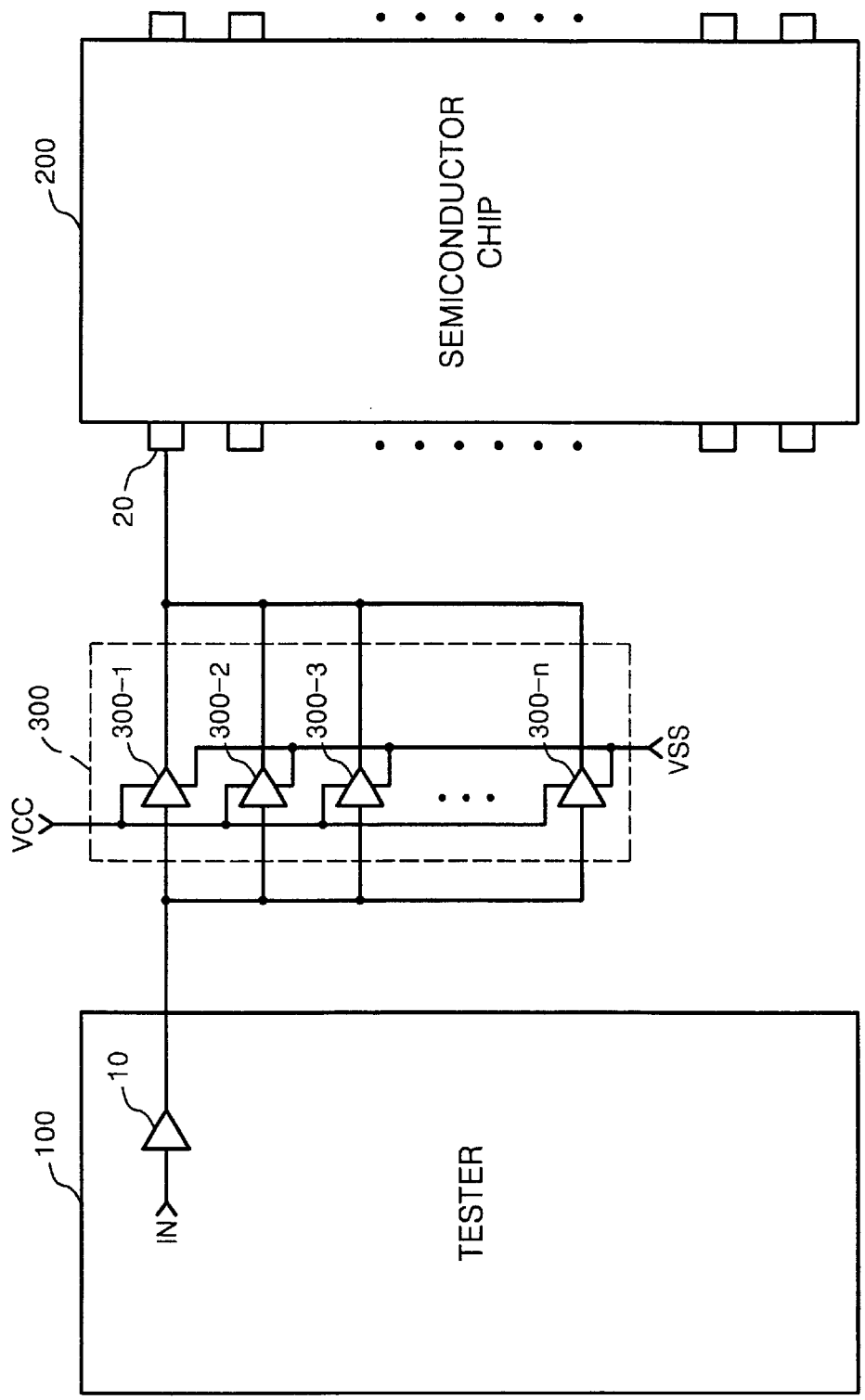
FIG. 2 is a block diagram of a testing circuit to test ground noise immunity of a tester of a semiconductor chip in accordance with another embodiment of the present invention.

FIG. 2 illustrates a plurality n of the driver ICs shown in FIG. 1, all connected in parallel. As the current driving capacity of each buffer within driver IC300 is relatively small, n driver ICs 300-1, 300-2, . . . , 300-n are connected in parallel to increase the current driving capacity. In FIG. 2, the driver ICs are represented by buffers.

In other words, as shown in FIG. 2, if one driver IC does not provide sufficient current, then n driver ICs can be connected in parallel to ensure sufficient current for noise immunity test purposes.

The test system thus generate signals at regular or irregular time intervals in accordance with the testing program of the tester 100, thereby inducing sufficient ground nose to test the immunity of semiconductor chip 300 in a more realistic operational environment.

Figure 3:
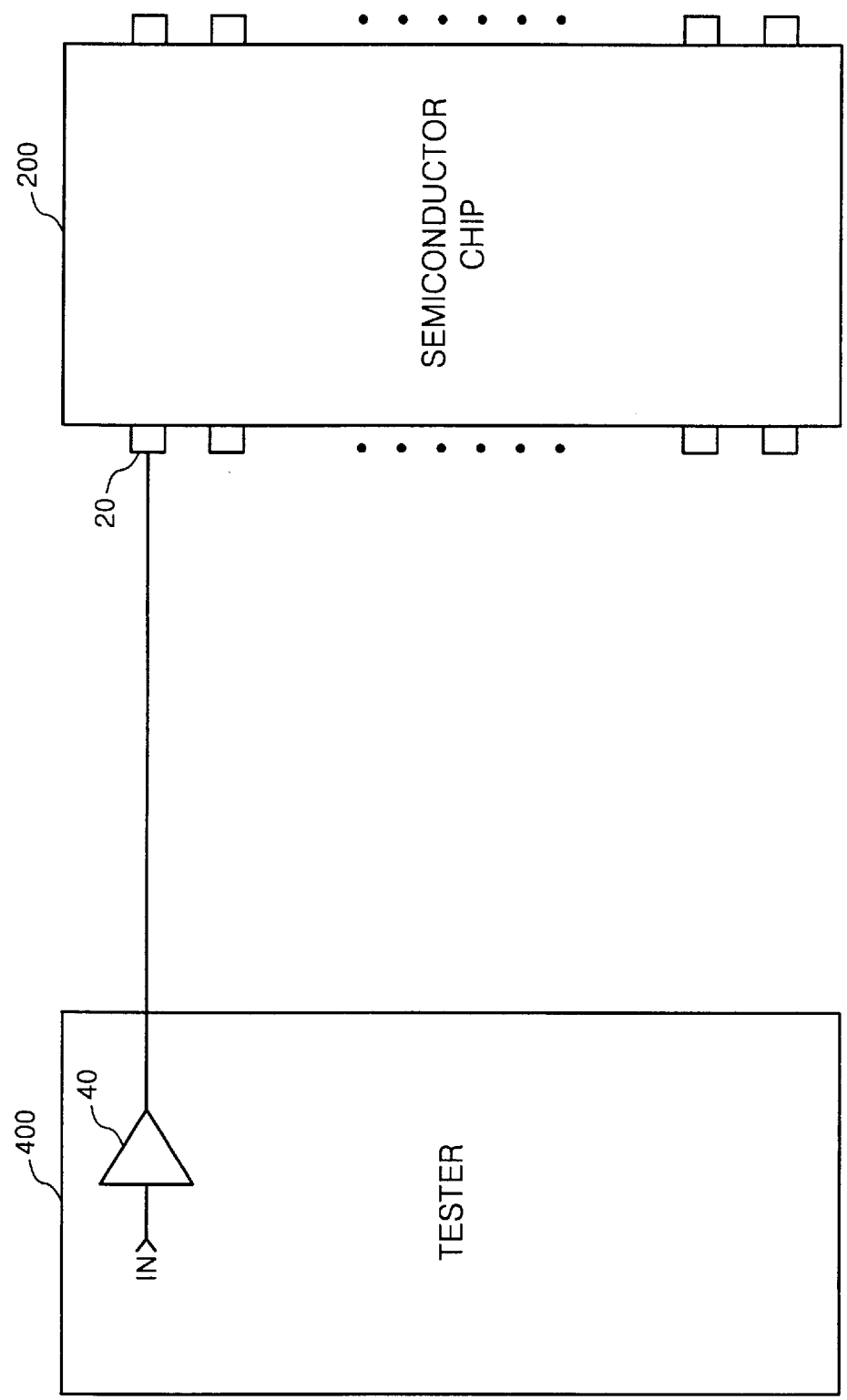
FIG. 3 is a block diagram for illustrating a tester having a function of testing ground noise immunity.

FIG. 3 illustrates the invention in accordance with another embodiment. In FIG. 3, a tester of a semiconductor chip internally performs the function of testing ground noise immunity. Tester 400 comprises a pin driver 40 having a large current driving capacity, so that ground noise may be induced at grounding terminal 20 of semiconductor chip 200 without having separate driver ICs outside the tester as shown in FIGS. 1 and 2.

A plurality of pin drivers such as illustrated pin driver 40 may be provided inside the tester 400. Among those plural pin drivers, a predetermined number of pin drivers have large current driving capacity to thereby test the ground noise immunity of a semiconductor chip. The remainder of the plural pin drivers 40 within tester 400 have small current driving capacity, as in conventional tester 100 of FIG. 1. Those skilled in the art will appreciate that the complement of small current driving capacity pins in tester 400 are conventional and are not shown or described. They will be understood to be useful in driving signal terminals of the semiconductor ship or terminals of the chip other than the ground applying terminal at which ground noise is induced in accordance with the invention.

Figure 4:
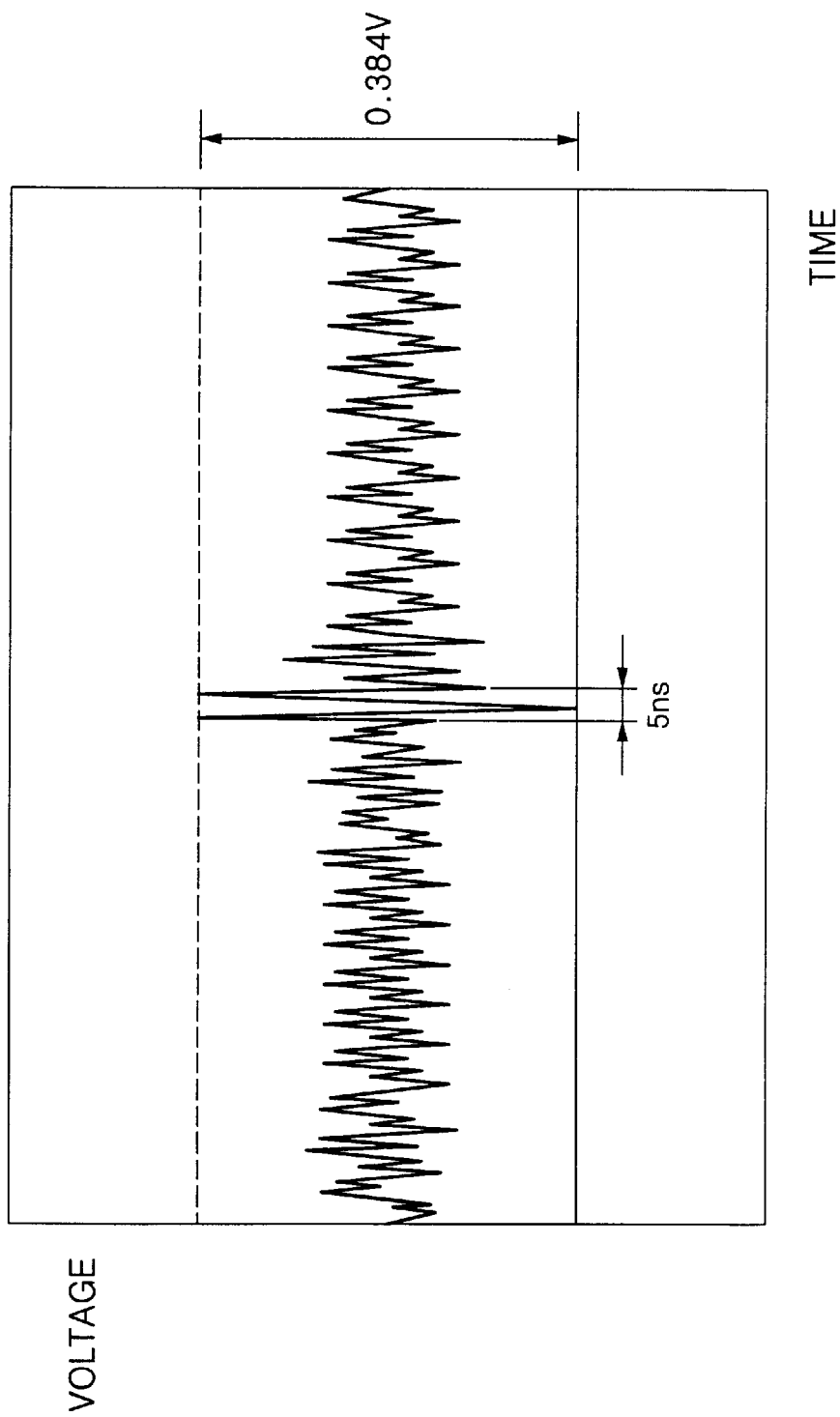
FIG. 4 illustrates measured waveforms of the ground noise that characterizes a semiconductor chip when mounted or assembled in a circuit or electronic system.

FIG. 4 shows results of the ground noise measured when a semiconductor chip is packaged and assembled in a typical circuit. An average ground noise of 0.384V is measured for 5 nanoseconds (ns) as shown in FIG. 4.

As shown in FIG. 4, there are differences in results of ground noise measured depending on circuit layout on printed circuit boards. However, it can be concluded that the generating ground noise is within about 0.4V.

Thus, in the present invention, the semiconductor chip preferably is tested while the ground noise of approximately 0.4V is applied to the ground terminal of the semiconductor chip at regular or irregular time interval, which enables the invented test system to measure the ground noise immunity of the semiconductor chip.

In order to measure the ground noise immunity of the semiconductor chip in the present invention, a driver having large current driving capacity is connected between the pin driver and the ground voltage applying terminal of the semiconductor chip as shown in FIGS. 1 and 2, or a predetermined number of pin drivers of the tester are assigned to increase the current driving capacity as shown in FIG. 3.

Therefore, the method for measuring the ground noise immunity of the semiconductor chip of the present invention is that the ground noise of the semiconductor chip is measured by inducing in the ground voltage applying terminal of the semiconductor chip to be tested the same magnitude of ground noise that may also be realized by the semiconductor chip in the operational world in which the chip is packaged and assembled into a circuit as part of an electronic control system.

The semiconductor chip testing system of the present invention can test ground noise immunity of the semiconductor chip by adding an external driver IC that effectively increases the current driving capacity of the pin driver of the tester.

Also, the tester of the semiconductor chip of the present invention can induce ground noise into the semiconductor chip by increasing the current driving capacity of a pin driver inside the tester, without adding an external driver IC having large current driving capacity.

Either inventive approach to increasing current driving capacity in a semiconductor chip test system more closely approximates the ground noise realized by the chip in operation, e.g., when it is packaged and mounted on a printed circuit board or otherwise assembled within an electronic device or system.

As a result, there is an advantage in the ground noise immunity testing system and the tester of the present invention in that the ground noise that may be seen by the semiconductor chip in operation is induced to the semiconductor chip when the semiconductor is tested. The immunity of the chip from ground noise is more effectively tested, and a semiconductor chip with insufficient ground noise immunity is properly classified as defective.

What is claimed is:

1. A semiconductor chip testing system which comprises:
    a tester with a predetermined number of pin drivers, said pin drivers including a first and second set of pin drivers of two different types, the first set of pin drivers having a relatively large current driving capacity and a second set of pin drivers having a relatively small current driving capacity;
    first driving means connected between said first set of the pin drivers of the tester and a ground voltage applying terminal of the semiconductor chip to be tested, wherein control signals are applied to the pin drivers to generate ground noise at the ground voltage applying terminal of the semiconductor chip; and
    second driving means connected between said second set of the pin drivers of the tester and a test pattern-applying terminal of the semiconductor chip, said second driving means operating concurrently with said first driving means to pattern-test the semiconductor chip according to a test pattern via the second set of pin drivers having the relatively small driving capacity,
    thereby concurrently performing both ground noise-immunity testing and pattern testing of the semiconductor chip.

2. The system, as defined in claim 1, wherein the first driving means applies current greater than that required to operate semiconductor chip to be tested.

3. The system, as defined in claim 2, wherein the first driving means comprises a predetermined number of buffers connected in parallel.

4. The system, as defined in claim 1, wherein the control signals are regularly applied by the tester at a predetermined time interval.

5. The system, as defined in claim 2, wherein the control signals are irregularly applied by the tester.

6. A tester of the semiconductor chip comprising:
    a predetermined number of pin drivers with large current driving capacity provided of a first type for ground noise immunity-testing the semiconductor chip, wherein control signals are applied to the pin drivers with large current driving capacity according to a ground noise immunity test program to apply ground noise to a ground voltage-applying terminal of the semiconductor chip; and
    a predetermined number of pin drivers with small current driving capacity provided of a second type that is different from the first type, the second type for pattern-testing the semiconductor chip, wherein control signals are applied to the pin drivers with small current driving capacity according to a pattern test program to apply signal patterns to a pattern test-applying terminal of the semiconductor chip,
    wherein control signals are applied to the pin drivers with large current driving capacity according to a test program to apply ground noise to a ground voltage-applying terminal of a semiconductor chip to be tested via the pin drivers with the large current driving capacity while the semiconductor chip is concurrently tested according to the pattern test program via the pin drivers with a small current driving capacity according to a test program to apply signal patterns to a pattern test-applying terminal of the semiconductor chip to be tested.

7. The tester, as defined in claim 6, wherein the ground noise control signals are regularly applied by the tester at a predetermined time interval.

8. The tester, as defined in claim 6, wherein the ground noise control signals are irregularly applied by the tester.

9. The tester, as defined in claim 6, wherein the current driving capacity of the large current driving capacity pin drivers is larger than that required to operate the semiconductor chip to be tested.

10. A method of using the tester according to claim 6 to test the semiconductor chip, said method comprising ground noise immunity testing the semiconductor chip by applying ground noise to the ground voltage-applying terminal of the semiconductor chip.

11. A method according to claim 10, wherein applying ground noise to the ground voltage-applying terminal of the semiconductor chip comprises applying control signals to the pin drivers of the first type according to a ground noise immunity test program.

12. A method according to claim 10, further comprising applying signal patterns to a pattern test-applying terminal of the semiconductor chip to perform a pattern test on the semiconductor device.

13. A method according to claim 12, wherein applying signal patterns to a pattern test-applying terminal of the semiconductor chip comprises applying control signals to the pin drivers of the second type according to a pattern test program.

14. A method according to claim 12, wherein the pattern test and the ground noise immunity test on the semiconductor device are performed concurrently.

15. A method of testing a semiconductor device, said method comprising:
    connecting a first set of pin drivers of a tester with a ground voltage applying terminal of a semiconductor device to be tested, the first set of pin drivers having a relatively large current driving capacity; and
    performing a ground noise immunity test on the semiconductor device by applying control signals to the pin drivers according to a testing method of a tester to generate ground noise at the ground voltage applying terminal of the semiconductor chip.

16. A method according to claim 15, further comprising:
    connecting a second set of pin drivers of the tester to a pattern-applying terminal of the semiconductor device to be tested, wherein each of said pin drivers of the second set have a relatively small current driving capacity; and
    performing a pattern test on the semiconductor chip according to a test pattern using the second set of pin drivers, wherein said pattern test is performed concurrently with the ground noise-immunity test.

17. A method according to claim 15, wherein the first set of pin drivers is connected to the semiconductor device through a first driving means.

18. A method according to claim 17, wherein the first driving means applies current greater than that required to operate semiconductor chip to be tested.

19. A method according to claim 17, wherein the first driving means comprises a predetermined number of buffers connected in parallel.

20. A method according to claim 15, wherein the control signals are regularly applied at a predetermined time interval.

* * * * *

UNITED STATES PATENT AND TRADEMARK OFFICE
CERTIFICATE OF CORRECTION

PATENT NO.   : 6,429,676 B1
DATED        : August 6, 2002
INVENTOR(S)  : Chun et al.

It is certified that error appears in the above-identified patent and that said Letters Patent is hereby corrected as shown below:

Column 5,
Line 33, "applied by the tester at a" should read -- applied at a --.
Line 36, "applied by the tester." should read -- applied. --.
Lines 65-66, "the ground noise control" should read -- the control --.

Column 6,
Lines 1-2, "the ground noise control" should read -- the control --.
Line 2, "applied by the tester." should read -- applied. --.
Lines 4-5, "the current driving capacity of the large current driving capacity pin" should read -- The magnitude of large current driving capacity of pin --.
Lines 39-40, "drivers according to a testing method of a tester to generate" should read -- drivers to generate --.

Signed and Sealed this

Eleventh Day of March, 2003

JAMES E. ROGAN
*Director of the United States Patent and Trademark Office*